United States Patent
Wen

(10) Patent No.: US 10,332,806 B2
(45) Date of Patent: Jun. 25, 2019

(54) SEMICONDUCTOR DEVICE

(71) Applicant: Nuvoton Technology Corporation, Hsinchu (TW)

(72) Inventor: Wen-Ying Wen, Hsinchu (TW)

(73) Assignee: Nuvoton Technology Corporation, Hsinchu (TW)

( * ) Notice: Subject to any disclaimer, the term of this patent is extended or adjusted under 35 U.S.C. 154(b) by 0 days.

(21) Appl. No.: 15/823,606

(22) Filed: Nov. 28, 2017

(65) Prior Publication Data

US 2018/0151437 A1 May 31, 2018

(30) Foreign Application Priority Data

Nov. 28, 2016 (TW) .............................. 105139096 A

(51) Int. Cl.

| H01L 21/74 | (2006.01) |
| H01L 27/02 | (2006.01) |
| H01L 27/06 | (2006.01) |
| H01L 29/06 | (2006.01) |
| H01L 29/10 | (2006.01) |
| H01L 29/66 | (2006.01) |
| H01L 29/73 | (2006.01) |
| H01L 29/735 | (2006.01) |
| H01L 21/8249 | (2006.01) |

(52) U.S. Cl.
CPC .......... *H01L 21/8249* (2013.01); *H01L 21/74* (2013.01); *H01L 27/0229* (2013.01); *H01L 29/1008* (2013.01); *H01L 29/1095* (2013.01); *H01L 29/66234* (2013.01); *H01L 29/73* (2013.01); *H01L 29/735* (2013.01); *H01L 27/0623* (2013.01); *H01L 29/0649* (2013.01)

(58) Field of Classification Search
CPC ..... H01L 29/73; H01L 21/74; H01L 29/0821; H01L 29/1004

See application file for complete search history.

(56) References Cited

U.S. PATENT DOCUMENTS 4,017,882 A * 4/1977 Kannam ............. H01L 27/0248
  257/497
4,972,247 A * 11/1990 Patterson ............ H01L 29/0626
  257/546

(Continued)

FOREIGN PATENT DOCUMENTS

TW  201423990  6/2014

OTHER PUBLICATIONS

Donald A. Neamen, "The Bipolar Transistor", Semiconductor Physics and Devices:Basic Principles, 4e, with English translation, pp. 1-5.

(Continued)

*Primary Examiner* — Charles D Garber
*Assistant Examiner* — Alia Sabur
(74) *Attorney, Agent, or Firm* — JCIPRNET

(57) ABSTRACT

Provided is a semiconductor device including a substrate having a P-type conductivity, a buried layer having an N-type conductivity, an NPN bipolar junction transistor (BJT), and a first well region having the P-type conductivity. The buried layer is located on the substrate. The NPN BJT is located on the buried layer. The first well region is located between the buried layer and the NPN BJT. The NPN BJT is separated from the buried layer by the first well region.

19 Claims, 2 Drawing Sheets

(56) References Cited

U.S. PATENT DOCUMENTS

| | | | |
|---|---|---|---|
| 6,611,044 B2 | 8/2003 | Pruijmboom et al. | |
| 9,048,132 B2 | 6/2015 | Ko | |
| 2004/0256678 A1* | 12/2004 | Goshima | H01L 21/8249 257/370 |
| 2010/0032766 A1* | 2/2010 | Chen | H01L 29/0821 257/370 |

OTHER PUBLICATIONS

"Office Action of Taiwan Counterpart Application", dated Apr. 17, 2017, p. 1-p. 4, in which the listed reference was cited.

* cited by examiner

SEMICONDUCTOR DEVICE

CROSS-REFERENCE TO RELATED APPLICATION

This application claims the priority benefit of Taiwan application serial no. 105139096, filed on Nov. 28, 2016. The entirety of the above-mentioned patent application is hereby incorporated by reference herein and made a part of this specification.

BACKGROUND OF THE INVENTION

Field of the Invention

The invention relates to an integrated circuit, and particularly relates to a semiconductor device.

Description of Related Art

A bipolar and complementary metal-oxide-semiconductor (BiCMOS) device is an integrated circuit which combines a bipolar junction transistor (BJT) device and a complementary metal-oxide-semiconductor (CMOS) device on the same chip. Thus, the BiCMOS device not only has the advantage of high speed of the BJT device, but also has the advantages of low energy consumption and high integration density of the CMOS device.

On the other hand, with the rise of environmental awareness, a high voltage integrated circuit having low power consumption and high-efficiency energy conversion has increasingly attracted attention. In general, the high voltage integrated circuit may include a high voltage side region and a low voltage side region. A voltage difference between the high voltage side region and the low voltage side region may be up to 100 V to 600 V or more. To separate the high voltage side region from the low voltage side region, it is usually required to form an isolated BJT device. However, the formation of the isolated BJT device in the high voltage side region not only complicates the process, but also forms a variety of parasitic BJT structures simultaneously.

SUMMARY OF THE INVENTION

The invention provides a semiconductor device which can effectively separate a buried layer from a bipolar junction transistor (BJT) thereon, thereby improving the flexibility of device configuration.

The invention provides a semiconductor device including a substrate having a first conductivity, a buried layer having a second conductivity, a first well region having the first conductivity, a second well region having the second conductivity, a body region having the first conductivity, a first doped region having the second conductivity, and a second doped region having the second conductivity. The buried layer is located on the substrate. The first well region is located on the buried layer. The second well region is located in the first well region. The body region is located in the second well region. The first doped region is located in the second well region. The second doped region is located in the body region. The first well region surrounds the second well region to separate the second well region from the buried layer.

According to an embodiment of the invention, the second well region extends to below the body region, such that a bottom surface of the second well region and a bottom surface of the body region are spaced apart by a distance therebetween.

According to an embodiment of the invention, the body region is in contact with the first well region.

According to an embodiment of the invention, the semiconductor device further includes a gate structure located on the substrate between the first doped region and the second doped region.

According to an embodiment of the invention, the gate structure partially overlaps the body region and partially overlaps the second well region.

According to an embodiment of the invention, the second well region is a collector, the second doped region is an emitter, and the body region is a base.

According to an embodiment of the invention, a doping concentration of the emitter is more than a doping concentration of the base, and the doping concentration of the base is more than a doping concentration of the collector.

According to an embodiment of the invention, the emitter, the base, and the collector are not connected to the buried layer.

According to an embodiment of the invention, the semiconductor device is a high voltage side semiconductor device, and the buried layer has a highest voltage.

According to an embodiment of the invention, the second doped region is annular and surrounds the first doped region.

According to an embodiment of the invention, the body region is annular and surrounds the second doped region.

According to an embodiment of the invention, the first conductivity and the second conductivity are different. One of the first conductivity and the second conductivity is an N-type conductivity, and another of the first conductivity and the second conductivity is a P-type conductivity.

The invention provides a semiconductor device including a substrate having a P-type conductivity, a buried layer having an N-type conductivity, an NPN BJT, and a first well region having the P-type conductivity. The buried layer is located on the substrate. The NPN BJT is located on the buried layer. The NPN bipolar junction transistor has a collector, an emitter, and a base. A doping concentration of the emitter is more than a doping concentration of the base, and the doping concentration of the base is more than a doping concentration of the collector. The first well region is located between the buried layer and the NPN BJT. The NPN BJT is separated from the buried layer by the first well region.

According to an embodiment of the invention, the NPN BJT includes a second well region having the N-type conductivity, a body region having the P-type conductivity, a first doped region having the N-type conductivity, and a second doped region having the N-type conductivity. The second well region is located in the first well region. The body region is located in the second well region. The first doped region is located in the second well region. The second doped region is located in the body region.

According to an embodiment of the invention, the body region is in contact with the first well region.

According to an embodiment of the invention, the semiconductor device further includes a gate structure located on the substrate between the first doped region and the second doped region.

According to an embodiment of the invention, the second well region is the collector, the second doped region is the emitter, and the body region is the base.

According to an embodiment of the invention, the emitter, the base, and the collector are not electrically connected to the buried layer.

According to an embodiment of the invention, the semiconductor device further includes a third well region having the N-type conductivity which surrounds the first well region, and the third well region is connected to the buried layer.

Based on the above, the low voltage device having smaller size can be disposed in the high voltage side semiconductor device in the invention, thereby decreasing the size or using area of the high voltage side semiconductor device to meet the trend of thin and light of current devices. Particularly, the first well region having the P-type conductivity is disposed between the buried layer having the N-type conductivity and the NPN BJT in the invention. The first well region surrounds the bottom surface and the sidewalls of the NPN BJT to separate the NPN BJT from the buried layer, such that the configuration of the NPN BJT on the high voltage side semiconductor device is more flexible. Additionally, the first well region may also be in contact with the base of the NPN BJT to form an extension region of the base, so as to facilitate the wiring of the base.

In order to make the aforementioned features and advantages of the disclosure more comprehensible, embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
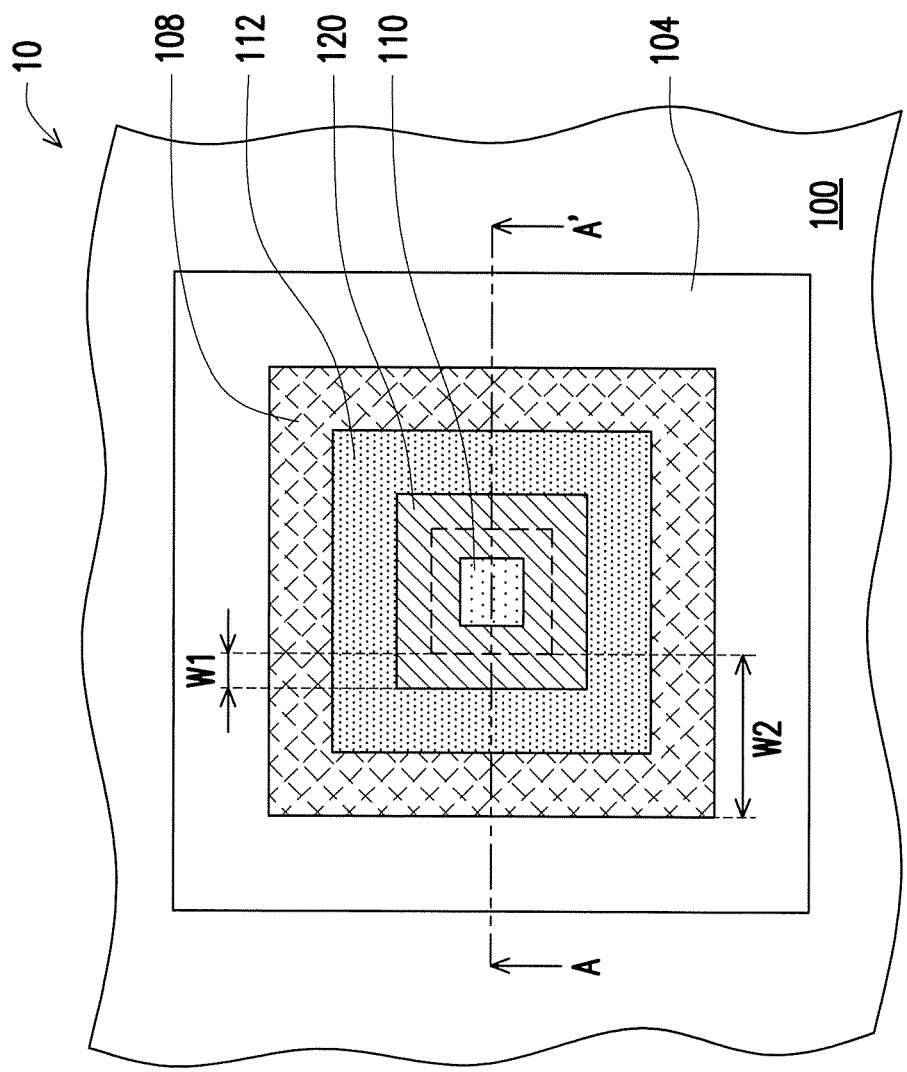
FIG. 1 is a top view of a semiconductor device according to an embodiment of the invention.

The invention is illustrated more comprehensively referring to the drawings of the embodiments. However, the invention may be embodied in many different forms and should not be construed as limited to the embodiments set forth herein. Thicknesses of layers and regions in the drawings may be enlarged for clarity. The same or similar reference numbers represent the same or similar components, and are not repeated again in the following paragraphs.

In the following embodiments, a first conductivity and a second conductivity are different. In an embodiment, the first conductivity is N-type, and the second conductivity is P-type. In another embodiment, the first conductivity is P-type, and the second conductivity is N-type. A P-type dopant is boron, for example, and an N-type dopant is phosphorous or arsenic, for example. In the embodiment, the first conductivity is P-type and the second conductivity is N-type as an example to describe. However, the invention is not limited thereto.

Figure 2:
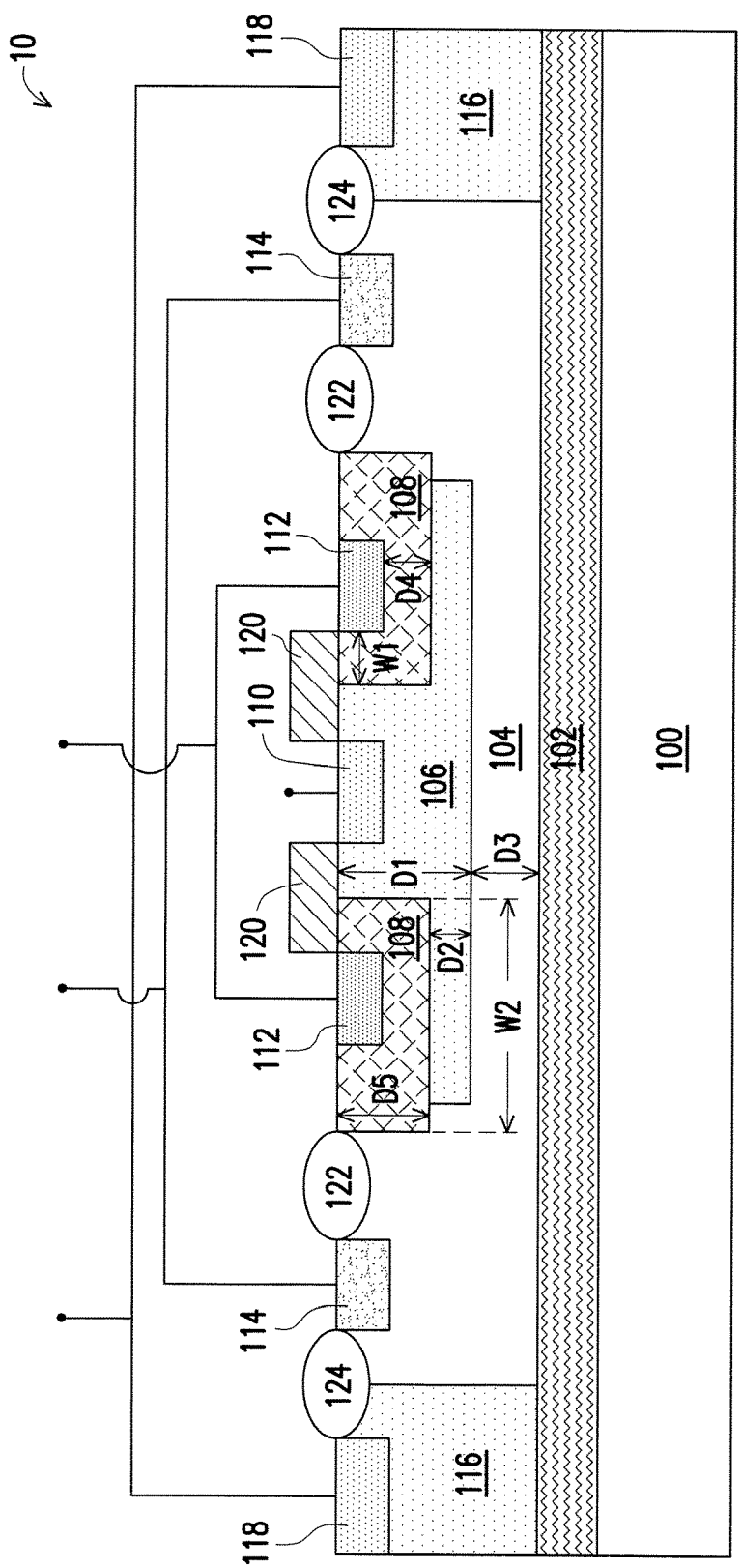
FIG. 2 is a schematic cross-sectional view taken along a line A-A' of FIG. 1.

FIG. 1 is a top view of a semiconductor device according to an embodiment of the invention. FIG. 2 is a schematic cross-sectional view taken along a line A-A' of FIG. 1. For clarity of illustration, only a substrate, a first well region, a body region, a first doped region, a second doped region, and a gate structure are illustrated in FIG. 1.

Referring to FIG. 1 and FIG. 2, a semiconductor device 10 of the embodiment includes a substrate 100 having the first conductivity, a buried layer 102 having the second conductivity, a first well region 104 having the first conductivity, a second well region 106 having the second conductivity, a body region 108 having the first conductivity, a first doped region 110 having the second conductivity, and a second doped region 112 having the second conductivity.

As shown in FIG. 1, the semiconductor device 10 of the embodiment is a device with a concentric appearance. Particularly, the first well region 104, the body region 108, the second doped region 112, and a gate structure 120 are concentrically arranged around the first doped region 110 as a center. However, the invention is not limited thereto. In other embodiments, the semiconductor device 10 of the embodiment may also have a non-concentric appearance or an eccentric appearance.

In an embodiment, the substrate 100 may be a semiconductor substrate, a semiconductor compound substrate, or a semiconductor over insulator (SOI). The semiconductor is, for example, a Group IVA atom, such as silicon or germanium. The semiconductor compound is, for example, a semiconductor compound formed from Group IVA atoms, such as silicon carbide or silicon germanium, or a semiconductor compound formed from Group IIIA atoms and Group VA atoms, such as gallium arsenide.

As shown in FIG. 2, the buried layer 102 is located on the substrate 100. In an embodiment, the buried layer 102 may be an N-type buried layer, an N-type epitaxial layer (N-epi), an N-type deep well region (deep N-well), or a combination thereof. In an embodiment, a method of forming the buried layer 102 may be an ion implantation process. A doping concentration of the buried layer 102 is $1 \times 10^{17}/cm^3$ to $1 \times 10^{21}/cm^3$.

The first well region 104 is located on the buried layer 102. In an embodiment, the first well region 104 may be a high voltage P-type well region (HVPW). In an embodiment, a method of forming the first well region 104 may be a lithography process and an ion implantation process. A doping concentration of the first well region 104 is $1 \times 10^{15}/cm^3$ to $1 \times 10^{17}/cm^3$.

The second well region 106 is located in the first well region 104. In an embodiment, the second well region 106 may be a collector. As shown in FIG. 2, a bottom surface of the second well region 106 and a bottom surface of the first well region 104 are spaced apart by a distance or a depth D3 therebetween to separate the second well region 106 from the buried layer 102. The depth D3 may make the second well region 106 be electrically isolated from the buried layer 102 substantially. In an embodiment, the depth D3 may be between 3 µm and 5 µm. In an embodiment, the second well region 106 may be an N-type well region (NW). In an embodiment, a method of forming the second well region 106 may be a lithography process and an ion implantation process. A doping concentration of the second well region 106 is $1 \times 10^{16}/cm^3$ to $1 \times 10^{18}/cm^3$.

The body region 108 is located in the second well region 106. In an embodiment, the body region 108 may be a base. As shown in FIG. 2, a depth D1 of the second well region 106 is larger than a depth D5 of the body region 108. The second well region 106 may extend to below the body region 108, such that the bottom surface of the second well region 106 and a bottom surface of the body region 108 are spaced apart by a distance or a depth D2 therebetween. On the other hand, the body region 108 has a width W2. One side of the body region 108 is located below the gate structure 120, and another side of the body region 108 may be aligned with a sidewall of the second well region 106 or over the sidewall of the second well region 106. In an embodiment, the second well region 106 at least covers one sidewall and a portion of bottom surface of the body region 108, such that the body region 108 is in contact with the first well region 104 by another sidewall. In an alternative embodiment, the second well region 106 may also completely cover all the sidewalls and the bottom surface of the body region 108, such that the body region 108 is not in contact with the first well region 104. In an embodiment, a method of forming the body region 108 may be an ion implantation process with a tilt angle. A doping concentration of the body region 108 is $1\times10^{17}/\text{cm}^3$ to $1\times10^{19}/\text{cm}^3$.

The first doped region 110 is located in the second well region 106. In an embodiment, a method of forming the first well region 110 may be an ion implantation process. A doping concentration of the first doped region 110 is $1\times10^{19}/\text{cm}^3$ to $1\times10^{21}/\text{cm}^3$.

The second doped region 112 is located in the body region 108. In an embodiment, the second doped region 112 may be an emitter. Specifically, one side of the second doped region 112 near the gate structure 120 and one side of the body region 108 near the gate structure 120 have a width W1 therebetween. In other words, the width W1 is equal to the width of the body region 108 that overlaps the gate structure 120. A bottom surface of the second doped region 112 and the bottom surface of the body region 108 have a depth D4 therebetween. In an embodiment, the width W1 may be smaller than or equal to the depth D4. In an embodiment, a method of forming the second doped region 112 may be a lithography process and an ion implantation process. A doping concentration of the second doped region 112 is $1\times10^{19}/\text{cm}^3$ to $1\times10^{21}/\text{cm}^3$.

In an embodiment, the doping concentration of the second doped region 112 is more than the doping concentration of the body region 108. The doping concentration of the body region 108 is more than the doping concentration of the second well region 106. Additionally, although the body region 108 and the second doped region 112 illustrated in FIG. 2 are two regions respectively, the second doped region 112 is annular and surrounds the first doped region 110 from FIG. 1. The body region 108 is annular and surrounds the first doped region 110 and the second doped region 112.

It should be noted that the first well region 104 surrounds the second well region 106 to separate the second well region 106 from the buried layer 102. Specifically, as shown in FIG. 2, the first well region 104 covers the second well region 106 and the body region 108 protruding the sidewalls of the second well region 106, such that both the second well region 106 and the body region 108 are not in contact with the buried layer 102. That is, when the semiconductor device 10 of the embodiment is a high voltage side semiconductor device, the configuration or design of the high voltage side semiconductor device is not limited by the buried layer 102 having the highest voltage. Therefore, the configuration or design of the semiconductor device 10 of the embodiment will become more flexible to meet the needs of customers or designers.

In an embodiment, the body region 108, the second well region 106, and the second doped region 112 may constitute an NPN bipolar junction transistor (BJT). In this case, the body region 108 may be regarded as a base, the second well region 106 may be regarded as a collector, and the second doped region 112 may be regarded as an emitter. The NPN BJT is separated from the buried layer 102 by the first well region 104. In other words, the base, the collector, and the emitter in the NPN BJT are not in contact with the buried layer 102. Thus, the configuration or design of the NPN BJT is not limited by the buried layer 102 having the highest voltage. Therefore, the NPN BJT (or a low voltage device) having smaller size and higher speed can be disposed in the high voltage side semiconductor device in the embodiment, thereby decreasing the size or using area of the high voltage side semiconductor device to meet the trend of thin and light of the current devices.

Referring to FIG. 2, the semiconductor device 10 of the embodiment further includes the gate structure 120, a third well region 116 having the second conductivity, a third doped region 118 having the second conductivity, a fourth doped region 114 having the first conductivity, and isolation structures 122 and 124.

The gate structure 120 is located on the substrate 100 between the first doped region 110 and the second doped region 112. The gate structure 120 may include a gate dielectric layer and a gate electrode on the gate dielectric layer (not shown). A material of the gate dielectric layer may be silicon oxide, silicon oxynitride, or a combination thereof, for example. A material of the gate electrode includes a conductive material, such as metal, undoped polycrystalline silicon, doped polycrystalline silicon, metal silicide, or a stacked layer formed of a combination thereof. From FIG. 1, the gate structure 120 partially overlaps the body region 108. The overlapped region has the width W1. The gate structure 120 is also annular and surrounds the first doped region 110. From FIG. 2, the gate structure 120 covers a portion of surface of the body region 108 and covers a portion of surface of the second well region 106. In an embodiment, the gate structure 120 may be grounded. However, the invention is not limited thereto.

Referring to FIG. 2, the third well region 116 surrounds the first well region 104, and the third well region 116 is connected to the buried layer 102. The third doped region 118 is located in the third well region 116, and the third doped region 118 may be used as an electrical contact of the buried layer 102. In an embodiment, a method of forming the third well region 116 and the third doped region 118 may be a lithography process and an ion implantation process. A doping concentration of the third well region 116 is $1\times10^{16}/\text{cm}^3$ to $1\times10^{18}/\text{cm}^3$. A doping concentration of the third doped region 118 is $1\times10^{19}/\text{cm}^3$ to $1\times10^{21}/\text{cm}^3$. In an embodiment, a bottom surface of the third well region 116 is aligned with the bottom surface of the first well region 104. However, the invention is not limited thereto.

Additionally, the fourth doped region 114 is located in the first well region 104. Since the first well region 104 is connected to the body region 108, the first well region 104 may be regarded as an extension region of the body region 108. The fourth doped region 114 is used as an electrical contact of the body region 108 to facilitate the wiring of the body region 108. In an alternative embodiment, the first well region 104 may not be in contact with the body region 108. In this case, additional electrical contacts (not shown) can be added in the body region 108 to be used as the electrical contact of the body region 108.

Additionally, the isolation structure 122 is located on the first well region 104 between the body region 108 and the fourth doped region 114. The isolation structure 124 is located between the fourth doped region 114 and the third doped region 118. The isolation structure 124 covers a portion of a top surface of the third well region 116 and covers a portion of a top surface of the first well region 104. In an embodiment, the isolation structures 122 and 124 may be shallow trench isolation (STI) structures or local oxidation of silicon (LOCOS), for example.

In summary, the low voltage device having smaller size can be disposed in the high voltage side semiconductor device in the invention, thereby decreasing the size or using area of the high voltage side semiconductor device to meet the trend of thin and light of current devices. Particularly, the first well region having the P-type conductivity is disposed between the buried layer having the N-type conductivity and the NPN BJT in the invention. The first well region surrounds the bottom surface and the sidewalls of the NPN BJT to separate the NPN BJT from the buried layer, such that the configuration of the NPN BJT on the high voltage side semiconductor device is more flexible. Additionally, the first well region may also be in contact with the base of the NPN BJT to form the extension region of the base, so as to facilitate the wiring of the base.

Although the invention has been described with reference to the above embodiments, it will be apparent to one of ordinary skill in the art that modifications to the described embodiments may be made without departing from the spirit of the invention. Accordingly, the scope of the invention is defined by the attached claims not by the above detailed descriptions.

What is claimed is:

1. A semiconductor device, comprising:
    a substrate having a first conductivity;
    a buried layer having a second conductivity, located on the substrate;
    a first well region having the first conductivity, located on the buried layer;
    a second well region having the second conductivity, located in the first well region, wherein the second well region is in contact with the first well region:
    a body region having the first conductivity, located in the second well region;
    a first doped region having the second conductivity, located in the second well region;
    a second doped region having the second conductivity, located in the body region, wherein the first well region surrounds the second well region to separate the second well region from the buried layer; and
    wherein the second conductivity is different from the first conductivity.

2. The semiconductor device according to claim 1, wherein the second well region extends to below the body region, such that a bottom surface of the second well region and a bottom surface of the body region are spaced apart by a distance therebetween.

3. The semiconductor device according to claim 1, wherein the body region is in contact with the first well region.

4. The semiconductor device according to claim 1, further comprising a gate structure located on the substrate between the first doped region and the second doped region.

5. The semiconductor device according to claim 4, wherein the gate structure partially overlaps the body region and partially overlaps the second well region.

6. The semiconductor device according to claim 1, wherein the second well region is a collector, the second doped region is an emitter, and the body region is a base.

7. The semiconductor device according to claim 6, wherein a doping concentration of the emitter is more than a doping concentration of the base, and the doping concentration of the base is more than a doping concentration of the collector.

8. The semiconductor device according to claim 6, wherein the emitter, the base, and the collector are not connected to the buried layer.

9. The semiconductor device according to claim 1, wherein the semiconductor device is a high voltage side semiconductor device, and the buried layer has a highest voltage of the high voltage side semiconductor device.

10. The semiconductor device according to claim 1, wherein the second doped region is annular and surrounds the first doped region.

11. The semiconductor device according to claim 1, wherein the body region is annular and surrounds the second doped region.

12. The semiconductor device according to claim 1, wherein the first conductivity and the second conductivity are different, one of the first conductivity and the second conductivity is an N-type conductivity, and another of the first conductivity and the second conductivity is a P-type conductivity.

13. A semiconductor device, comprising:
    a substrate having a P-type conductivity;
    a buried layer having an N-type conductivity, located on the substrate;
    an NPN bipolar junction transistor, located on the buried layer, the NPN bipolar junction transistor having a collector, an emitter, and a base, wherein a doping concentration of the emitter is more than a doping concentration of the base, and the doping concentration of the base is more than a doping concentration of the collector; and
    a first well region having the P-type conductivity, located between the buried layer and the NPN bipolar junction transistor, wherein the NPN bipolar junction transistor is separated from the buried layer by the first well region, and the collector is in contact with the first well region.

14. The semiconductor device according to claim 13, wherein the NPN bipolar junction transistor comprises:
    a second well region having the N-type conductivity, located in the first well region;
    a body region having the P-type conductivity, located in the second well region;
    a first doped region having the N-type conductivity, located in the second well region; and
    a second doped region having the N-type conductivity, located in the body region.

15. The semiconductor device according to claim 14, wherein the body region is in contact with the first well region.

16. The semiconductor device according to claim 14, further comprising a gate structure located on the substrate between the first doped region and the second doped region.

17. The semiconductor device according to claim 14, wherein the second well region is the collector, the second doped region is the emitter, the body region is the base.

18. The semiconductor device according to claim 17, wherein the emitter, the base, and the collector are not electrically connected to the buried layer.

19. The semiconductor device according to claim 13, further comprising a third well region having the N-type conductivity surrounding the first well region, and the third well region being connected to the buried layer.

* * * * *